(12) United States Patent
Ota

(10) Patent No.: US 6,485,153 B2
(45) Date of Patent: *Nov. 26, 2002

(54) EXPOSURE APPARATUS AND METHOD

(75) Inventor: Kazuya Ota, Ohta-ku (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/320,710

(22) Filed: May 27, 1999

(65) Prior Publication Data

US 2002/0017616 A1 Feb. 14, 2002

(30) Foreign Application Priority Data

May 29, 1998 (JP) .......................... 10-166320

(51) Int. Cl.⁷ ................................ G02B 5/10
(52) U.S. Cl. ..................... 359/859; 359/731
(58) Field of Search .............. 250/492.1, 491.1; 359/859, 731, 364, 365, 727, 730, 857, 858, 861

(56) References Cited

U.S. PATENT DOCUMENTS

| 4,780,617 A | 10/1988 | Umatate et al. |
| 4,962,318 A | 10/1990 | Nishi |
| 5,151,750 A | 9/1992 | Magome et al. |
| 5,448,332 A | 9/1995 | Sakakibara et al. |
| 5,815,310 A | 9/1998 | Williamson |
| 5,995,263 A | 11/1999 | Tokuda et al. |
| 6,142,641 A * | 11/2000 | Cohen et al. ............... 359/859 |
| 6,204,509 B1 * | 3/2001 | Yahiro et al. ............ 250/491.1 |

FOREIGN PATENT DOCUMENTS

| JP | 61-85650 | * 5/1986 | .............. 250/492.1 |
| JP | A-6-283403 | 10/1994 | |
| JP | A-9-211332 | 8/1997 | |

* cited by examiner

Primary Examiner—Kiet T. Nguyen
(74) Attorney, Agent, or Firm—Oliff & Berridge, PLC

(57) ABSTRACT

An exposure apparatus is provided wherein an illumination beam emitted from a mask is projected onto a substrate, through a projection optical system having a reflecting optical element that includes a reflecting region for reflecting the illumination beam at a position spaced from an optical axis of the projection optical system, and a space portion that is provided on the side of the optical axis with respect to the reflecting region. The apparatus further includes a position detecting device for detecting position information of the substrate, at least part of which is located in the space of the reflecting optical element.

27 Claims, 8 Drawing Sheets

EXPOSURE APPARATUS AND METHOD

BACKGROUND OF THE INVENTION

1. Field of the Invention

The present invention relates to exposure apparatus and method used in a lithography process for manufacturing, for example, semiconductor devices, liquid crystal displays, plasma displays, thin film magnetic heads, image pickup devices (such as CCD), and photomasks (reticles). In particular, the present invention is concerned with scanning exposure apparatus and method wherein a photomask and substrate are moved relative to each other with respect to an exposure beam.

2. Related Background Art

In a lithography process for manufacturing, for example, semiconductor devices (such as LSI), step-and-repeat type reduction projection exposure apparatuses, or so-called steppers, and step-and-scan type reduction projection exposure apparatuses, or so-called scanning steppers, have been mainly used. In recent years, scanning steppers, which can more easily achieve high-accuracy large-area exposure than steppers, have been dominantly used in order to meet increasing fineness or smaller feature size, and increasing size of semiconductor devices.

In the exposure apparatus as described above, a reduced image of a device pattern is projected onto a wafer through a projection optical system, while alignment marks are detected by an off-axis alignment system located on one side of the projection optical system. Reasons why this alignment system is used will now be explained.

The projection optical system has image-forming characteristics (for example, aberration) that are suitably adjusted according to the wavelength of illumination light for exposure. Where an on-axis type alignment system is employed which detects alignment marks on a wafer via the projection optical system, therefore, the system must use alignment light whose wavelength is close to the exposure wavelength. As the wavelength of the illumination light for exposure gets shorter and shorter, it becomes considerably difficult to select light to which a resist on the wafer is not sensitive, and which causes only small chromatic aberration in the projection optical system. For this reason, the off-axis type alignment system has been increasingly employed which is able to determine the wavelength or width of the alignment light irrespective of the exposure wavelength. In the meantime, an automatic focusing sensor is also provided on one side of the projection optical system.

In a known exposure apparatus, an L-shaped alignment optical system unit with a bent optical axis is disposed at one side of an optical element that is located closest to the wafer in the projection optical system. Thus, the distance between the center of detection of the alignment optical system unit and the position at which a reticle pattern is projected (and which is typically represented by the center of the optical axis of the projection optical system), i.e., the baseline distance, can be reduced as compared with the case where a cylindrical alignment optical system unit with a straight optical axis is provided. The above L-shaped arrangement that can reduce the baseline distance has been generally used for improved stability of the mark detecting accuracy (alignment accuracy) that depends upon the baseline distance.

With the L-shaped arrangement as described above, however, the alignment optical system cannot provide a large numerical aperture (N.A.), thus making it difficult to improve the mark detection accuracy. Namely, in order to improve the resolving power of the exposure apparatus, the N.A. of the projection optical system needs to be increased to, for example, 0.6 or larger, resulting in an increased aperture of the projection optical system. Even if the L-shaped arrangement as described above is employed, it is extremely difficult to locate an objective lens closer to the wafer than mirrors or prisms adapted to bend the optical axis of the alignment optical system. Accordingly, the distance or spacing between the objective lens and the surface of the wafer is increased, and thus the aperture of the objective lens must be increased. It is not easy to produce a large-aperture objective lens with a small aberration, and, even if such a lens is produced, it cannot be positioned without interfering with the projection optical system. Thus, it was inevitable for the known apparatus to use an objective lens with a small N.A.

In order to deal with a wide variety of processes, namely, to improve the mark detection accuracy for each layer, the exposure apparatus as described above includes a plurality of alignment systems of different detection types, for example, FIA (Field Image Alignment) type, LIA (Laser Interferometric Alignment) type, and LSA (Laser Step Alignment) type, as disclosed in U.S. Pat. No. 4,962,318 and U.S. Pat. No. 5,151,750. Where the plural alignment systems are incorporated in a single alignment optical system unit such that at least part of the unit is used in common for these systems, the optical path needs to be diverged or split into a plurality of paths by means of a beam splitter(s). As a result, the structure of the optical system becomes complicated, and the quantity of light of an alignment beam is undesirably reduced, which impedes an improvement of the detecting accuracy. Thus, it has not been easy to satisfy both requirements for dealing with a wide variety of process and improving the detecting accuracy at the same time.

In the meantime, the automatic focus sensor as indicated above includes a light transmitting system and a light receiving system, which are located at respective positions that are spaced from the optical axis of the projection optical system. Accordingly, the relative positional relationship between the light transmitting system and the light receiving system tends to vary due to vibrations, thermal deformation, and the like, and the variations in the positional relationship make it difficult to achieve highly accurate detection, and result in a lack of stability. Also, the automatic focusing sensor is inevitably uses an objective lens having a small N.A. or aperture, for the same reason as described above with respect to the off-axis type alignment system.

Thus, the known exposure apparatus suffers from a lot of problems to be solved for improvement in the accuracy with which the position of the wafer is detected.

SUMMARY OF THE INVENTION

It is therefore an object of the present invention to provide exposure apparatus and method that assure improved accuracy with which the position of a substrate is detected, and improved accuracy in overlaying the mask and the substrate. In particular, the present invention aims at providing such exposure method and apparatus that permit highly accurate detection of the position of the substrate, so as to enable the substrate to be exposed with an exposure beam through a projection optical system including a reflecting optical element located close to the image plane of the system. It is another object of the invention to provide a method for manufacturing devices, which method includes steps of detecting the position information of the substrate with high accuracy, and transferring a device pattern on a workpiece.

EUV exposure apparatuses using EUV (Extreme Ultra Violet) light having a wavelength in the range of 5–20 nm, for example, 13.4 nm or 11.5 nm, as exposure light have begun to be developed as exposure apparatuses in the next generation, wherein a circuit pattern whose practical minimum line width (design rule) is about 50 nm to 35 nm is transferred onto a substrate (wafer). In the absence of any optical element that can pass EUV light therethrough, the EUV exposure apparatus is required to use a reflection type reticle, and a reflection type projection optical system consisting solely of reflecting optical elements.

The reflection type projection optical system has an arc shaped illumination region generally called "ring field", and is characterized in that the optical path of an illumination beam is offset with respect to the optical axis of the projection optical system. If all of the reflecting optical elements that constitute the projection optical system are located coaxially about the optical axis of the projection optical system, therefore, most of the reflecting optical elements include unnecessary regions that are not used for the purpose of reflecting the illumination beam, namely, regions that may be eliminated from the beginning or may be cut out. This is also true with the case of a reflection/refraction type projection optical system including refractive optical elements as part thereof, wherein an optical path of an illumination light beam is offset with respect to the optical axis of the projection optical system.

In a scanning exposure apparatus according to the first aspect of the present invention wherein a pattern of a mask is transferred onto a substrate through a projection optical system while the mask and substrate are moved in synchronism with each other, the projection optical system includes reflecting optical elements as at least part of the system, and at least one of the reflecting optical elements has an exposure-light reflecting region that is located at a position spaced or offset from the optical axis of the projection optical system, while a space including the optical path of exposure light is provided on the side of the optical axis with respect to the reflecting region, and a position detecting device for detecting the position of the substrate is located in at least a part of the space. Thus, the position detecting device can be located close to the optical path of the exposure light, namely, the illumination region. With this arrangement, the distance between an objective optical system of the position detecting device and the substrate can be reduced, thus permitting the use of an objective optical system having a large N.A., which leads to improved accuracy with which the position of the substrate is detected, and improved overlaying accuracy between the mask and the substrate.

In a scanning exposure apparatus according to the second aspect of the present invention wherein a pattern of a mask is transferred onto a substrate through a projection optical system while the mask and substrate are moved in synchronism with each other, the projection optical system includes reflecting optical elements as at least a part of the system, and one of the reflecting optical elements that constitute the projection optical system is located optically closest to the mask and physically closest to the substrate, while a space including the optical path of exposure light is present in a part of the above-indicated one reflecting element or an extended part thereof, and a position detecting device for detecting the position of the substrate is located in at least a part of the space. Thus, the position detecting device can be located close to the optical path of the exposure light, namely, the illumination region. With this arrangement, the distance between an objective optical system of the position detecting device and the substrate can be reduced, thus assuring an improved overlaying accuracy between the mask and the substrate.

In the exposure apparatuses according to the first and second aspects of the invention, where the position detecting device is a mark detecting device (such as an alignment optical system) for detecting marks formed on the substrate, for example, the distance between the center of detection of the mark detecting device and the center of projection of the projection optical system (namely, baseline distance) is remarkably reduced, thus assuring improved stability of the mark detecting device. Also, where the position detecting device is a focal position detecting device (focus sensor) for detecting the position information of the substrate as viewed in the direction parallel to the optical axis of the projection optical system, the length of the optical path of detection light is reduced, thus assuring improved the stability and reducing the size of the focal position detecting device.

DETAILED DESCRIPTION OF THE PREFERRED EMBODIMENTS

First Embodiment

Figure 1:
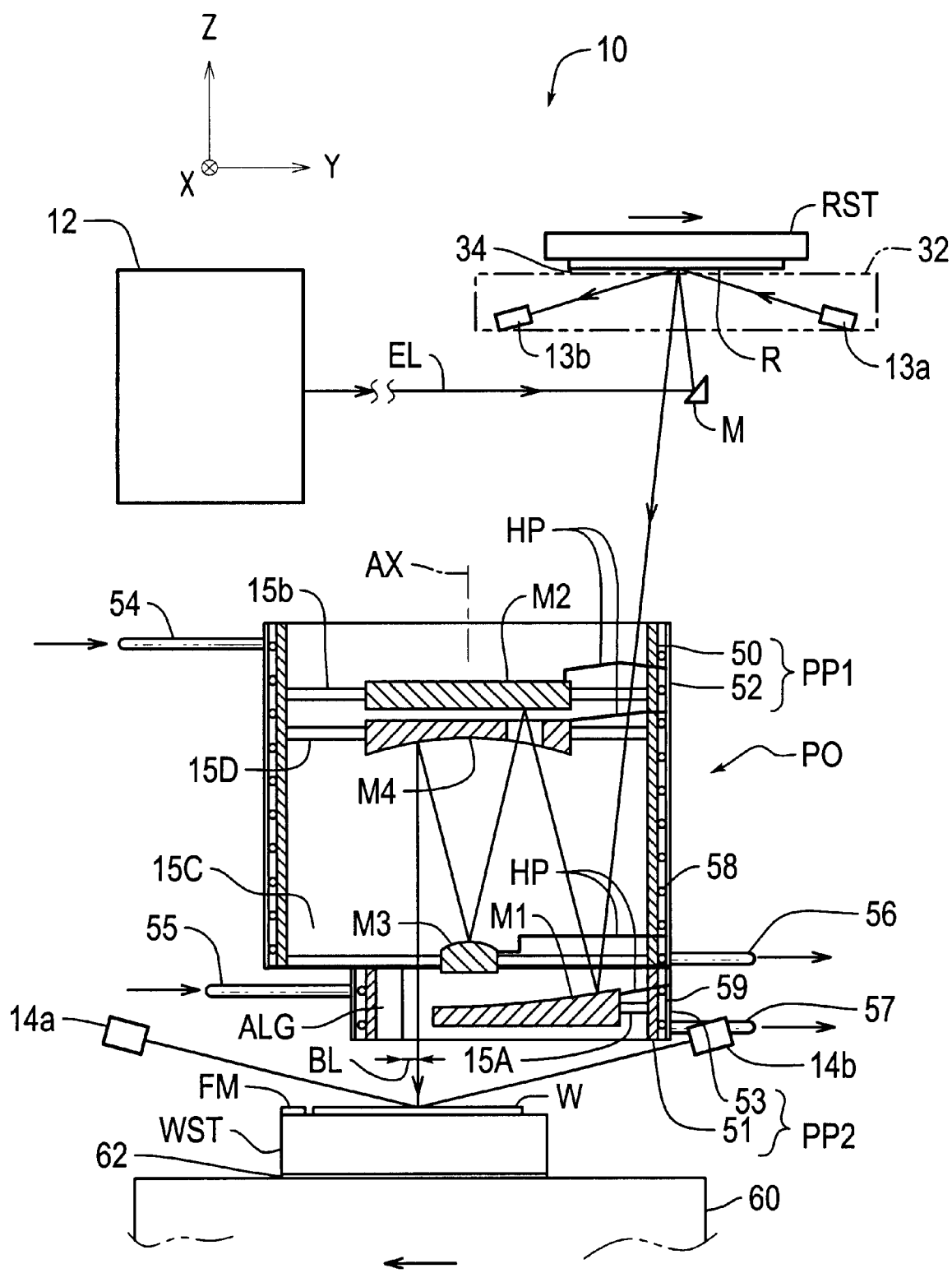
FIG. 1 is a view schematically showing the whole construction of a scanning exposure apparatus according to the first embodiment of the present invention.
Figure 2:
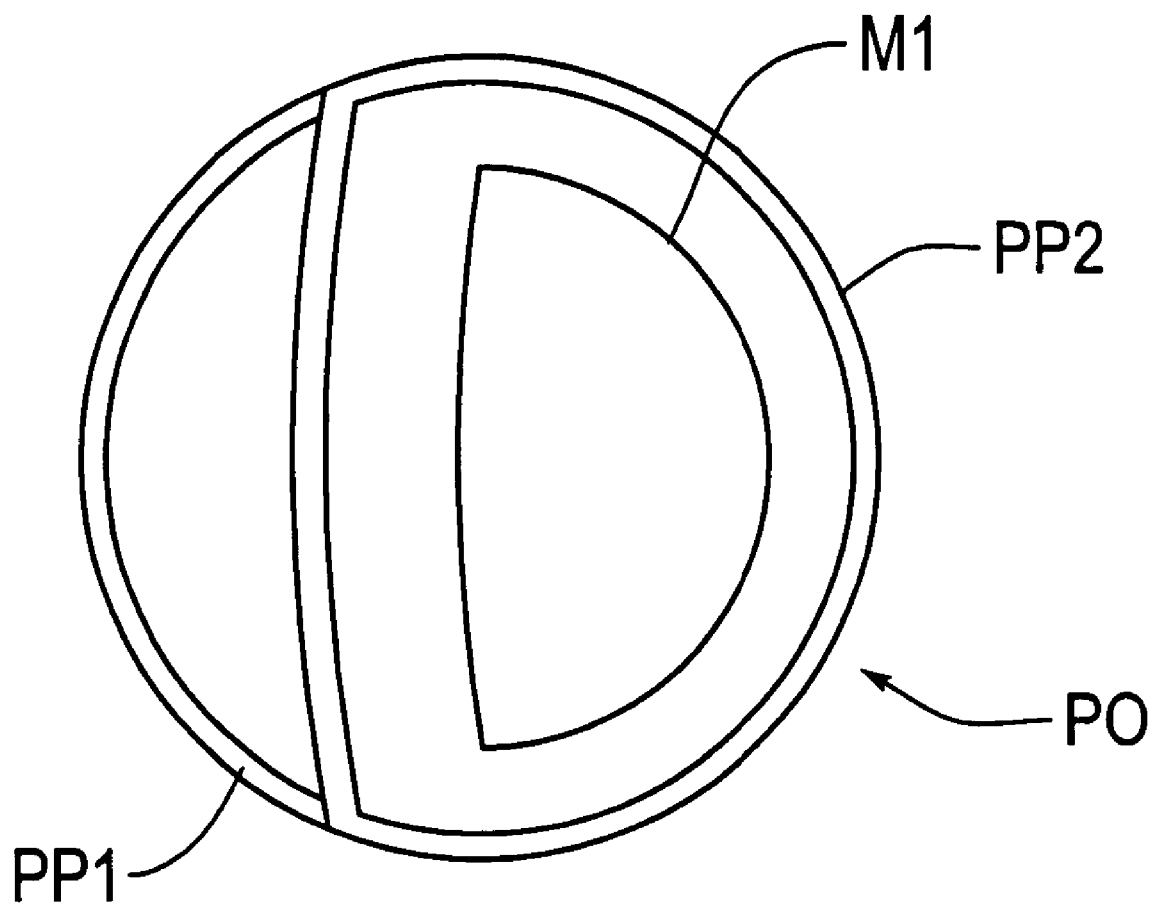
FIG. 2 is a view showing a projection optical system of FIG. 1.

Referring to FIG. 1 and FIG. 2, the first embodiment of the present invention will be described.

FIG. 1 schematically shows the whole construction of a scanning exposure apparatus 10 according to the first embodiment of the invention. The scanning exposure apparatus 10 includes a projection optical system PO that is telecentric only at the image plane where a substrate in the form of a wafer W is located, and the projection optical system PO projects a beam of light reflected from a reticle R as a mask disposed on the side of the object plane, onto the wafer W in a substantially vertical direction. In the following description, the direction of projection of illumination light EL from the projection optical system PO to the wafer W will be referred to as "optical-axis direction" of the projection optical system PO, which is also denoted as "Z-axis direction" in FIG. 1. In the plane perpendicular to the Z-axis direction, the direction that extends in parallel with the plane of the sheet having FIG. 1 will be referred to as "X-axis direction", and the direction perpendicular to the plane of the same sheet will be referred to as "Y-axis direction".

The scanning exposure apparatus 10 is adapted to individually move the reticle R and the wafer W in a one-dimensional direction (Y-axis direction in FIG. 1) relative to the projection optical system PO while projecting an image of a part of a circuit pattern formed on the reflection type reticle R serving as a mask, onto the wafer W as a substrate, through the projection optical system PO. In this manner, the whole image of the circuit pattern of the reticle R is transferred onto one of shot regions on the wafer W. Furthermore, the scanning exposure apparatus 10 is adapted to repeat this scanning exposure operation and stepping motion of the wafer W, thereby to transfer the whole image of the circuit pattern on a plurality of shot regions on the wafer W in a step-and-scan manner.

The scanning exposure apparatus 10 includes a light source unit 12 that emits, for example, EUV light (light in soft X-ray region) having a wavelength of 11.5 nm, and a reflecting mirror M (a part of an illumination optical system) that reflects the EUV light EL from the light source unit 12 so that the light EL is incident on a pattern plane (lower surface in FIG. 1) of the reticle R at a predetermined angle of incidence, e.g., about 50 mrad. The exposure apparatus 10 further includes a reticle stage RST that holds the reticle R, projection optical system that projects the EUV light EL reflected by the pattern plane of the reticle R onto the exposure plane of the wafer W in a substantially vertical direction, a wafer stage WST that holds the wafer W, and so on.

The light source unit 12 includes a light source for exposure, which consists of a laser excitation plasma light source, a parabolic mirror (not shown) serving as a condensing mirror, a wavelength selection window (not shown), and so forth. The EUV light EL emitted from the light source unit 12 is incident on an illumination optical system (not shown) including the reflecting mirror M and a field of view restricting member, and the illumination optical system irradiates the pattern plane of the reticle R with the EUV light EL, and defines an irradiation region of the EUV light EL on the pattern plane, in the form of an arc shaped slit.

The reticle stage RST is located above a reticle stage base 32 disposed in the X-Y plane, and is supported by a magnetic levitation type two-dimensional linear actuator 34 while floating above the reticle stage base 32. The reticle stage RST is driven by the magnetic levitation type two-dimensional actuator at a predetermined stroke (more specifically, a stroke of 100 mm or larger) in the Y direction, and also driven by minute amounts in the X direction and θdirection (direction of rotation about the Z axis). Also, the reticle stage RST may be driven by minute amounts in the Z direction and oblique directions with respect to the XY plane.

The position and amount of inclination of the reticle stage RST (reticle R) as viewed in the Z direction are measured by a reticle focus sensor 13 that consists of a light transmitting system 13a that obliquely emits a detecting beam FB1 to irradiate the pattern plane of the reticle R with the beam, and a light receiving system 13b that receives the detecting beam FB1 reflected by the pattern plane of the reticle R. As the reticle focus sensor 13 may be used a multi-point focus position detecting system as disclosed in U.S. Pat. No. 5,448,332 corresponding to laid-open Japanese Patent Publication No. 6-283403. While the multi-point focus position detecting system disclosed in the U.S. patent is adapted to detect the position of the wafer W to obtain position information, the multi-point focus position detecting system is used in the present embodiment for detecting the position of the reticle R. The disclosure of U.S. Pat. No. 5,448,332 is incorporated herein by reference. The position of the reticle stage RST in the XY plane, and its rotating amounts (yawing amount, pitching amount and rolling amount) are measured by a laser interferometric system (not shown).

Measurement values of the reticle focus sensor 13 and the laser interferometric system are supplied to a main control unit (not shown), which in turn controls the magnetic levitation type two-dimensional linear actuator 34 so that the position and posture of the reticle stage RST in six dimensions are suitably controlled.

A reticle R is held under suction on the lower surface of the reticle stage RST via a reticle holder (not shown) that operates as an electrostatic chuck. The reticle R consists of a thin plate, such as a silicon wafer, quartz, or heat resistance glass, and a reflecting film that reflects EUV light is formed on its surface (pattern plane). The reflecting film is a multi-layer film formed by laminating about 50 pairs of molybdenum Mo and beryllium Be films alternately, at a pitch of about 5.5 nm. The multi-layer film thus obtained has a reflectance of about 70% with respect to EUV light having a wavelength of 11.5 nm. Multi-layer films having the same structure as the multi-layer film formed on the surface of the reticle R are also formed on reflecting surfaces of mirrors (including the reflecting mirror M) that are respectively disposed in the light source unit 12, illumination optical system and the projection optical system PO.

An absorption layer of, for example, nickel Ni or aluminum Al is applied by coating onto the entire surface of the multi-layer film formed on the pattern plane of the reticle R. By patterning the absorption layer, a desired circuit pattern is formed from the reflection layer (multi-layer film as described above) and the absorption layer. Namely, a portion of EUV light that impinges upon part of the reticle R on which the absorption layer remains is absorbed by the absorption layer, and a portion of EUV light that impinges upon part of the reticle R from which the absorption layer is removed is reflected by the multi-layer film (reflection layer). The resulting EUV light that contains information of the circuit pattern is then reflected and enters the projection optical system PO.

The projection optical system PO, which is non-telecentric at the object plane and telecentric at the image plane, is in the form of a reflection optical system that consists of a plurality of reflecting optical elements (mirrors) (in a range of about three to eight mirrors, for example, four in the present embodiment of FIG. 1). The projection optical system PO has a numerical aperture (N.A.) of 0.1, and provides a projection magnification of, for example, ¼, ⅕ or ⅙. In the present embodiment, the projection optical system PO having a projection magnification of ¼ is employed. Thus, the EUV light EL that is reflected by the reticle R and contains pattern information formed on the reticle R is projected onto the wafer W through the projection optical system PO, so that the pattern on the reticle R is reduced to ¼ and transferred onto the wafer W.

Here the projection optical system PO will be described in greater detail. As shown in FIG. 1, the projection optical system PO principally consists of four mirrors (reflection optical elements) in total, i.e., a first mirror M1, second mirror M2, third mirror M3 and a fourth mirror M4, and a first lens barrel PP1 that holds the second to fourth mirrors M2–M4, and a second lens barrel PP2 that holds the first mirror M1. The first to fourth mirrors M1–M4 have reflecting surfaces that are rotationally symmetric about the optical axis AX of the projection optical system PO. The reflecting surfaces of the first mirror M1 and fourth mirror M4 are aspheric, and the reflecting surface of the second mirror M2 is flat, while that of the third mirror M3 is spherical. Each of the reflecting surfaces is formed with machining accuracy of less than about 1/50 to 1/60 of the exposure wavelength with respect to its design values, with errors of less than 0.2 nm to 0.3 nm as RMS values (standard deviations). Since the desired shape of the reflecting surface of each mirror is realized by alternately repeating measurement and machining, a convex reflecting surface like that of the third mirror M3 is desirably spherical so as to facilitate measurement thereof. This is because measurement of convex aspheric surfaces is difficult to be accomplished with sufficiently high accuracy.

As shown in FIG. 1, the fourth mirror M4 is formed with an aperture that allows a beam of light reflected by the first mirror M1 to reach the second mirror M2. FIG. 2 shows the projection optical system PO as seen from the bottom side (wafer side) thereof. As shown in FIG. 2, a part (left-hand end portion) of the first mirror M1 is cut out so that light reflected by the fourth mirror M4 can reach the wafer W, and the first mirror M1 as a whole is shaped like character "D" that is somewhat rounded. In accordance with the shape of the first mirror M1, the second lens barrel PP2 that holds the first mirror M1 has a slightly rounded D-like shape in cross section.

Since the projection optical system PO is placed under vacuum, there is no escape for heat stored in each of the mirrors M1–M4 due to irradiation with the illumination light EL. In the present embodiment, therefore, the following measures are adopted for alleviating or preventing deterioration of image-forming characteristics of the projection optical system PO due to thermal expansion of the mirrors M1–M4.

More specifically, the mirrors M2–M4 are fixed to the first lens barrel PP1 via a plurality of support members 15B, 15C and 15D, respectively, and the first mirror M1 is fixed to the second lens barrel PP2 via a plurality of support members 15A. The first lens barrel PP1 has a double structure consisting of an inner member 50, and a cooling jacket 52 mounted on the outer periphery of the inner member 50. The cooling jacket 52 incorporates a spiral pipe 58 through which a cooling liquid (for example, FLUORINERT (trade name)) flows from an inlet tube 54 to an outlet tube 56. Similarly, the second lens barrel PP2 has a double structure consisting of an inner member 51 and a cooling jacket 53 mounted on the outer periphery of the inner member 51, and the cooling jacket 53 incorporate a spiral pipe 59 through which a coolant liquid (for example, FLUORINERT (trade name)) flows from an inlet tube 55 to an outlet tube 57.

In addition, heat pipes (not shown), and the like, are provided between the respective mirrors M1–M4 and the corresponding lens barrels. The cooling jackets 52, 54 are connected to return ports of individual refrigeration systems (not shown) through the respective outlet tubes 56, 57, and discharge ports of these refrigeration systems are connected to the cooling jackets 52, 53 through the inlet tubes 54, 55, respectively. The cooling liquid that flows out through the outlet tubes 56, 57 exchanges heat with a refrigerant in each refrigeration system, to be thereby cooled down to a certain temperature, and then flows into the cooling jacket 52, 53, through the respective inlet tubes 54, 55. In this manner, the cooling liquid circulates through the inlet tubes 54, 55, spiral pipes 58, 59, outlet tubes 56, 57 and the refrigeration systems.

In the projection optical system PO of the present embodiment, the mirrors M1–M4 are respectively supported by the support members 15A–15D, and connected to the inner members 51, 50 of the second lens barrel PP2 and first lens barrel PP1 via the heat pipes HP. With this arrangement, even if heat energy is given to the mirrors M1, M2, M3, M4 when irradiated with the illumination light (EUV light) EL for exposure, these mirrors exchange heat, through the heat pipes HP, with the second lens barrel PP2 and first lens barrel PP1 whose temperatures are suitably controlled, so that the mirrors M1, M2, M3, M4 are cooled down to desired temperatures. In this case, the second lens barrel PP2 that holds the first mirror M1 and the first lens barrel PP1 that holds the remaining mirrors M2–M4 may be cooled to different target temperatures, thus enabling the target cooling temperature of the second lens barrel PP2 to be set lower than the target cooling temperature of the first lens barrel PP1. This is advantageous because the first mirror M1 is optically closest to the reticle R, and therefore absorbs the largest heat energy. Thus, the first to fourth mirrors can be cooled with high efficiency.

The four mirrors M1–M4 that constitute the projection optical system PO are formed of heat resistance glass ceramic (for example, ZERODUR (trade name) available from SCHOTT), or metal (for example, invar). Also, the four mirrors M1–M4 and the support members 15A–15D may be formed of materials having substantially the same coefficient of thermal expansion, or formed of the same material. Furthermore, the first and second lens barrels PP1, PP2 (inner members 50, 51) may be formed of the same material as that of the mirrors and the support members. In this case, the mirrors and their support members are free from bimetal effects that would be otherwise caused by a difference in the coefficient of thermal expansion therebetween, and thermal strains are prevented from arising in the mirrors, thus alleviating or preventing deterioration of image-forming characteristics of the projection optical system PO.

The wafer stage WST is disposed above the wafer stage base 60 placed in the XY plane, and supported by a magnetic levitation type two-dimensional linear actuator 62 while floating above the wafer stage base 60. The wafer stage WST is driven by the magnetic levitation type two-dimensional actuator 62 at a predetermined stroke (more specifically, a stroke of 300 mm to 400 mm) in the X direction and Y direction, and also driven by minute amounts in the θ direction (direction of rotation about the Z axis). Also, the wafer stage WST may be driven by minute amounts in the Z direction and oblique directions (directions of rotation about the X axis and Y axis) with respect to the XY plane.

A wafer holder (not shown), which is preferably of electrostatic chuck type, is mounted on the upper surface of the wafer stage WST, and a wafer W is held under suction by the wafer holder. The position of the wafer stage WST in the XY plane and its rotating amounts (yawing amount, pitching amount and rolling amount) are measured by a laser interferometric system (not shown). The Z-direction position of the wafer W with reference to the lens barrel is measured by an oblique incidence type wafer focus sensor 14. As shown in FIG. 1, the wafer focus sensor 14 consists of a light transmitting system 14a that is fixed to a column (not shown) that holds the lens barrels, and operates to obliquely emit a detection beam FB toward the wafer (W) surface, and a light-receiving system 14b that is also fixed to a column (not shown) that holds the lens barrels, and operates to receive the detection beam FB reflected by the wafer (W) surface. A similar multi-point focus position detecting system as used for the reticle focus sensor may be used as the wafer focus sensor 14. Such a multi-point focus position detecting system is disclosed in U.S. Pat. No. 5,448,332, for example, the disclosure of which is incorporated herein by reference.

Measurement values of the wafer focus sensor 14 (14a, 14b) and the laser interferometric system are supplied to a main control unit (not shown), which in turn controls the magnetic levitation type two-dimensional linear actuator 62, so that the position and posture of the wafer stage WST in six dimensions are suitably controlled.

A spatial image measuring device FM is provided on one end portion of the upper surface of the wafer stage WST, for measuring the relative relationship (distance), or baseline, between the position at which the pattern formed on the reticle R is projected, and the position of an alignment optical system ALG which will be described later. The spatial image measuring device FM corresponds to a fiducial mark plate of a conventional DUV (Deep Ultraviolet) exposure apparatus.

In the present embodiment, the alignment optical system ALG is fixed on the inner face of one side wall of the second lens barrel PP2 that faces in the negative Y direction, as shown in FIG. 1. The alignment optical system ALG may be selected from various types of alignment sensors or microscopes, such as an FIA (Field Image Alignment) type alignment sensor that irradiates alignment marks (or spatial image measuring device FM) on the wafer W with broad band light, and receives the reflected light so as to effect mark detection through image processing, or an LIA (Laser Interferometric Alignment) type alignment sensor that irradiates an alignment mark in the form of a diffraction grating on the wafer W with laser light in two different directions, and causes interference of two diffracted beams generated by the mark, so as to obtain the position information of the alignment mark. The alignment optical system ALG may also be an LSA (Laser Step Alignment) type alignment sensor that irradiates an alignment mark on the wafer W with laser light, and measure the position of the mark utilizing the intensity of light that has been diffracted and scattered, or a scanning probe microscope, such as an AFM (atomic force microscope). The FIA type, LIA type and LSA type alignment sensors are disclosed in, for example, U.S. Pat. No. 4,962,318 and U.S. Pat. No. 5,151,750, the disclosures of which are incorporated herein by reference. The AFM is disclosed in, for example, U.S. patent application Ser. No. 471,519 (filed Jun. 6, 1995), which is incorporated herein by reference.

The scanning exposure apparatus 10 of the present embodiment constructed as described performs exposure operations as described below.

Initially, a reticle R is transported by a reticle transportation system (not shown), and held under suction by the reticle stage RST that is placed in the loading position. The main control unit then operates to control the positions of the wafer stage WST and the reticle stage RST, and the spatial image measuring device FM detects a projected image of a reticle alignment mark (not shown) formed on the reticle R, so as to obtain the position at which the image of the reticle pattern is projected. In this manner, reticle alignment is accomplished.

In the next step, the main control unit operates to move the wafer stage WST so that the spatial image detector FM is located right below the alignment optical system ALG, and the relative distance between the projection position of the pattern image of the reticle R and the alignment optical system ALG, namely, the baseline distance BL, is obtained based on a detection signal of the alignment optical system ALG and measurement values of the laser interferometric system of the wafer stage WST.

After the baseline measurement is finished, the main control unit performs enhanced global alignment (EGA), to calculate the position of each shot region of the wafer W. The EGA is disclosed in, for example, U.S. Pat. No. 4,780,617, the disclosure of which is incorporated herein by reference.

Subsequently, step-and-scan exposure is performed using EUV light EL as illumination light for exposure. More specifically, the main control unit positions the wafer stage WST at the scanning start position of the first shot region, according to position information of each shot region on the wafer that was previously obtained, while monitoring position information from the interferometric system, and also positions the reticle stage RST at the scanning start position, so as to perform scanning exposure of the first shot region. During the scanning exposure operation, the main control unit operates to drive the reticle stage RST and wafer stage WST in the opposite directions, while controlling the speeds of both of the stages so that the speed ratio substantially coincides with the projection magnification of the projection optical system PO. In this manner, a transferred image of a 25 mm (width)×50 mm (scanning direction) circuit pattern, for example, is formed on the first shot region on the wafer W.

If the scanning exposure for the first shot region is finished in the above manner, the main control unit performs a stepping operation for moving the wafer stage WST to the scanning start position of the second shot region, and performs a scanning exposure operation on the second shot region in the same manner as described above. Similar operations are then performed on the third and following shot regions. Thus, the pattern of the reticle R is transferred to all of the shot regions on the wafer W in the step-and-scan manner.

During the scanning exposure operations and alignment as described above, the wafer focus sensor 14 (14a, 14b) measures the distance between the surface of the wafer W and the focal plane of the projection optical system PO, and inclination of the wafer W with respect to the XY plane (the focal plane of the projection optical system PO). The main control unit then controls the wafer stage WST so that the distance and parallelism between the surface of the wafer W and the focal plane of the projection optical system WST are kept constant. The main control unit also operates to move the reticle stage RST and the substrate stage WST in synchronism with each other in the Y-axis direction, while adjusting the position of the reticle R as detected in the optical-axis direction (Z-direction) of the projection optical system PO, so that the distance between the projection optical system PO and the pattern plane of the reticle R is kept constant during scanning exposure (during transfer of the reticle pattern).

In the scanning exposure apparatus 10 of the present embodiment as described above, a pattern of the reticle R is transferred onto the wafer W through the reflection type projection optical system PO, using EUV light EL having an extremely short wavelength as exposure light. Thus, a fine pattern with small element features can be transferred from the reticle R to each shot region on the wafer W with high accuracy. More specifically, fine patterns, such as a high-density pattern (periodic pattern) having a pitch of about 70 nm, an isolated pattern in which the line width is bout 50 nm, and a hole pattern of about 50 to 70 nm, can be transferred with high accuracy.

In the present embodiment, the alignment optical system ALG is disposed in a space that is present on the left-hand side of the first mirror M1, namely, in a space on the inner side of the second lens barrel PP2. This arrangement makes it possible to reduce the distance (baseline distance) between the center of detection of the alignment optical system ALG and the projection position of the reticle pattern which is represented by the center of a ring-like illumination region on the wafer W, thus assuring improved stability in detecting mark positions. Also, the alignment optical system ALG can be formed in the shape of a straight cylinder, and therefore the optical path of an alignment beam can be set to a small length, thus permitting the use of an objective lens having a large N.A. for measuring mark positions with even higher accuracy. With the alignment accuracy thus improved, the accuracy in the overlay exposure between the reticle pattern and each shot region of the wafer W can be improved.

Second Embodiment

Figure 3:
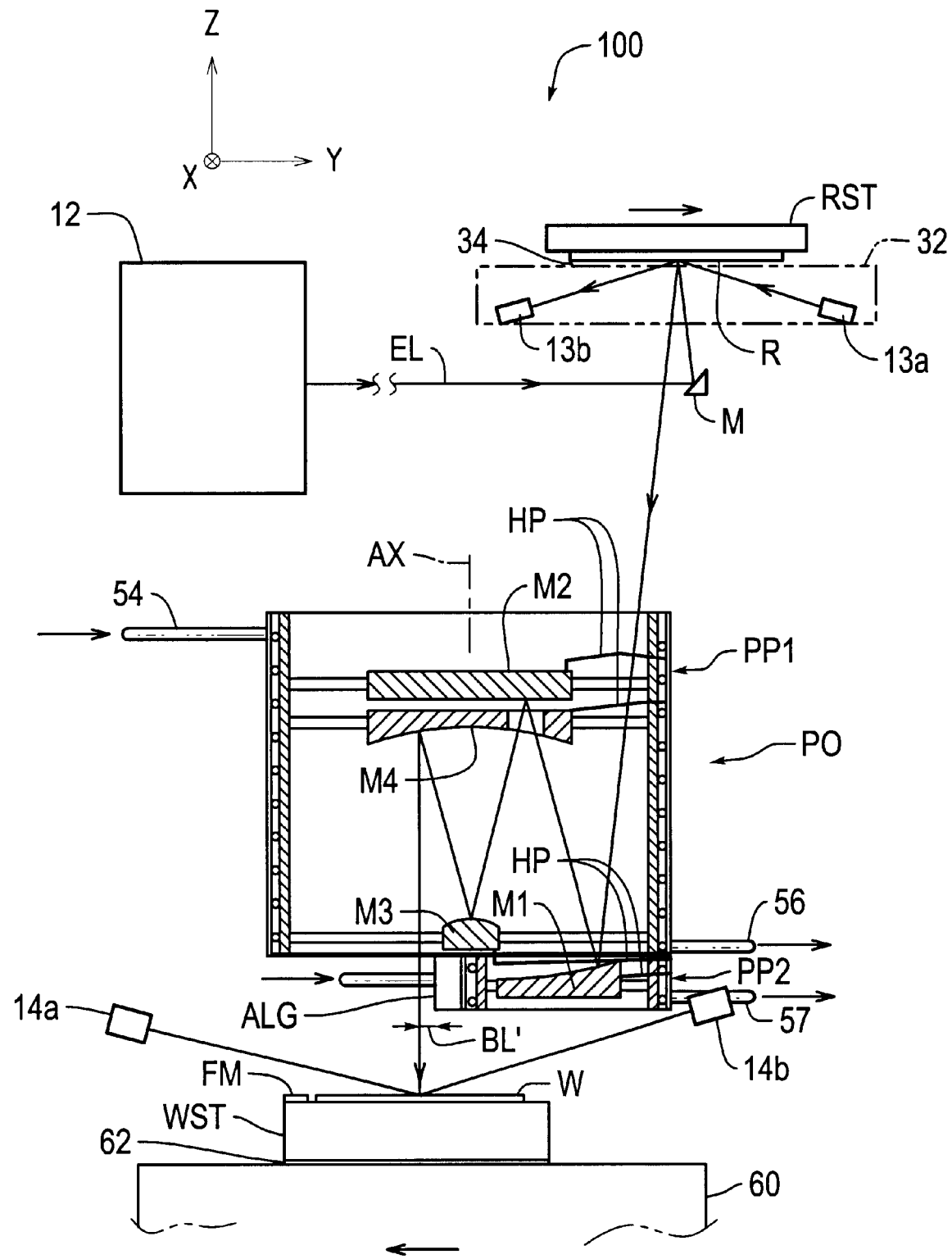
FIG. 3 is a view schematically showing the whole construction of a scanning exposure apparatus according to the second embodiment of the present invention.
Figure 4:
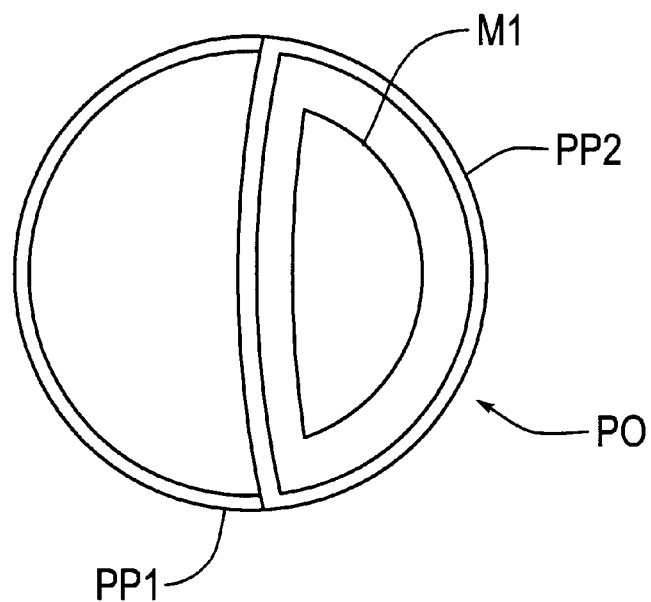
FIG. 4 is a view showing a projection optical system of FIG. 3.
Figure 5:
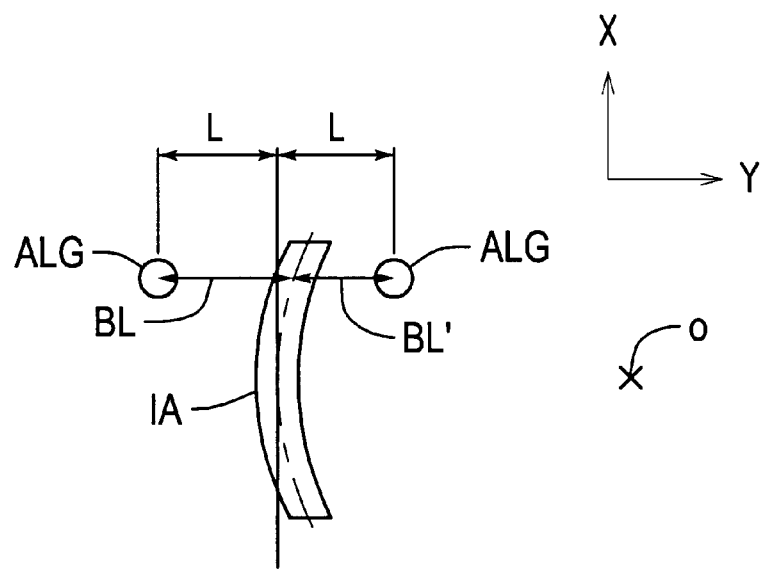
FIG. 5 is a view useful in explaining the effect of the second embodiment.

Referring next to FIG. 3 through FIG. 5, the second embodiment of the present invention will be described. Here, the same reference numerals as used in the first embodiment will be used for the same or equivalent components, of which no description will be provided.

FIG. 3 schematically shows the whole construction of a scanning exposure apparatus 100 according to the second embodiment of the invention. Like the scanning exposure apparatus 10 as described above, the scanning exposure apparatus 100 is adapted to perform exposure operations in a step-and-scan manner, using EUV light having a wavelength of 11.5 nm as illumination light EL for exposure.

In the scanning exposure apparatus 100, the first mirror M1 assumes a substantially semicircular shape as shown in FIG. 4, with a large cutout being formed through the left-hand side portion of its exposure light reflecting region, as compared with the first mirror of the first embodiment. In accordance with the shape of the first mirror M1, the second lens barrel PP2 also has a substantially semicircular cross-sectional shape, and the alignment optical system ALG is mounted on the outer surface of the second lens barrel PP2. The other portions of the apparatus are constructed similarly to the corresponding portions of the first embodiment.

The scanning exposure apparatus 100 of the second embodiment constructed as described above yields substantially the same effects as provided in the first embodiment. In addition, since the illumination region IA on the wafer W is a ring-like region having its center O on the optical axis of the projection optical system PO, the baseline distance BL' in the second embodiment is shorter than the baseline distance BL in the first embodiment except in the case where the mounting position of the alignment optical system ALG lies on the Y axis that passes through the center point of the illumination region IA. With the baseline distance thus reduced, the alignment optical system ALG is able to detect mark positions with even improved stability.

Third Embodiment

Figure 6:
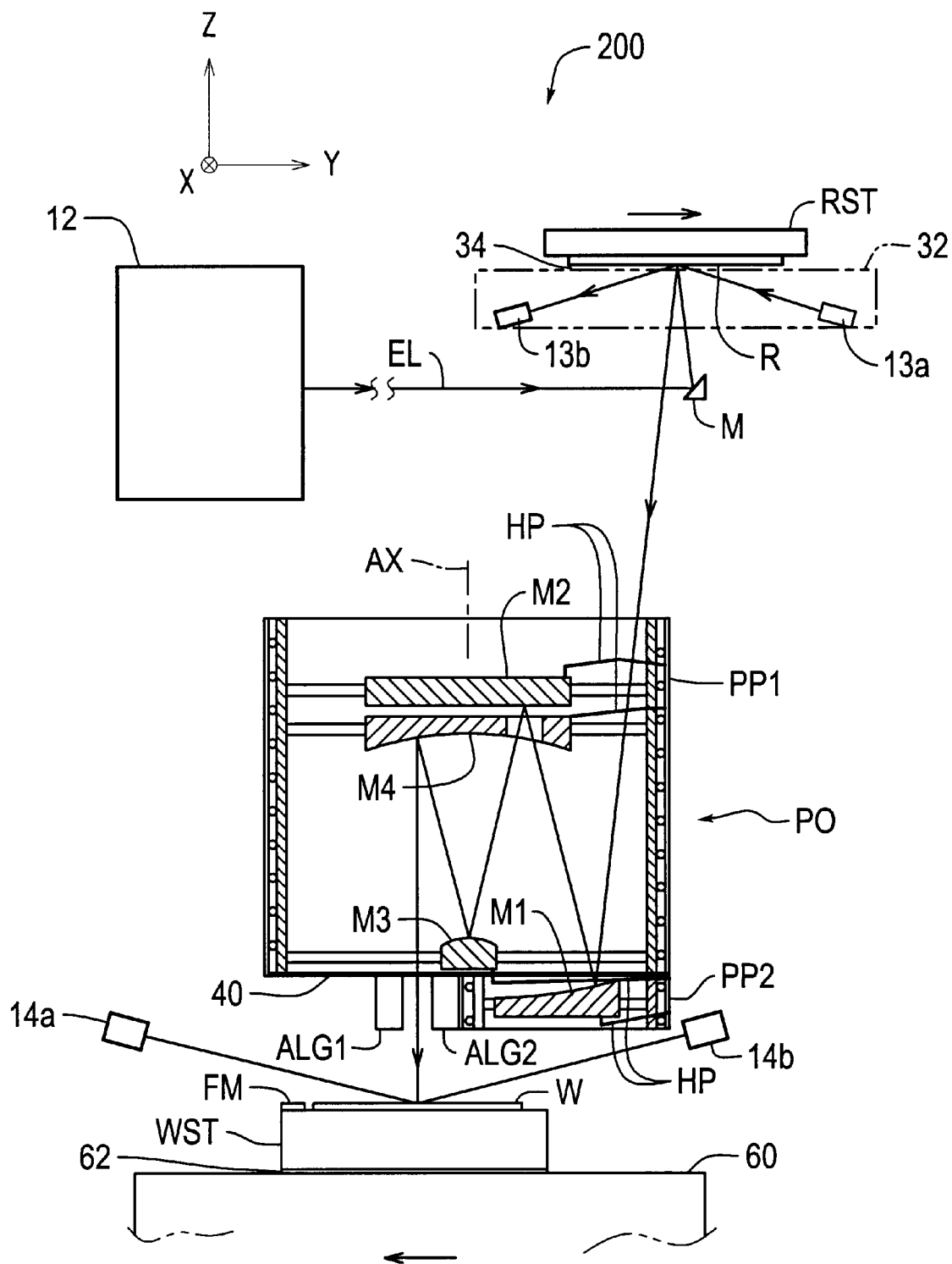
FIG. 6 is a view schematically showing the whole construction of a scanning exposure apparatus according to the third embodiment of the present invention.
Figure 7:
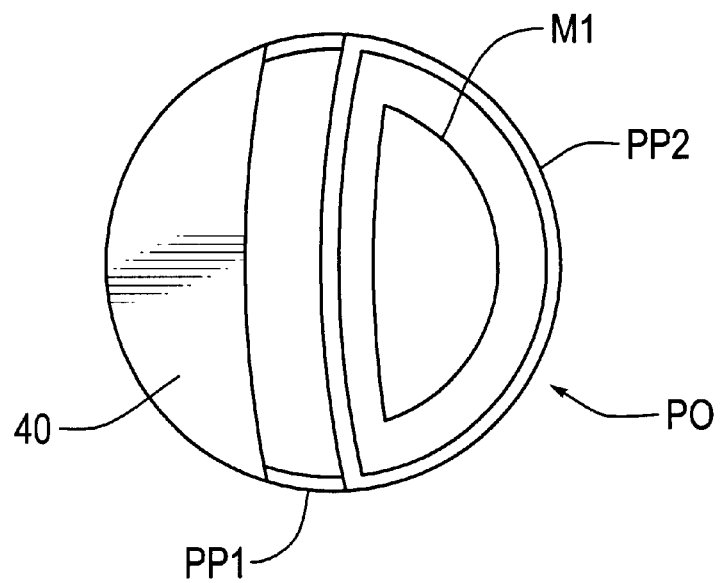
FIG. 7 is a view showing a projecting optical system of FIG. 6.
Figure 8:
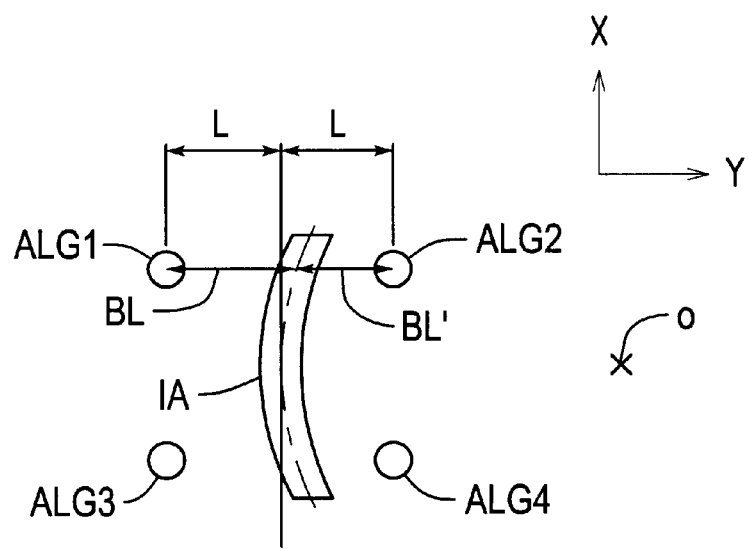
FIG. 8 is a view useful in explaining the effect of the third embodiment.

Referring next to FIG. 6 through FIG. 8, the third embodiment of the present invention will be described. Here, the same reference numerals as used in the first and second embodiments will be used for identifying the same or equivalent components, of which no description will be provided.

FIG. 6 schematically shows the whole construction of a scanning exposure apparatus 200 according to the third embodiment of the invention. The scanning exposure apparatus 200 is a step-and-scan type reduction projection exposure apparatus. The scanning exposure apparatus 200 is characterized in that a mirror similar to the first mirror of the second embodiment is used as the first mirror M1, that the second lens barrel PP2 also has a semicircular cross-sectional shape corresponding to the shape of the first mirror M1, as shown in FIG. 7, and that two alignment optical systems ALG1, ALG2 are provided.

In the scanning exposure apparatus 200, one of the alignment optical systems ALG1 is disposed on one side of a region through which exposure light (image-forming beam) passes, i.e., an illumination region, as viewed in the scanning direction, and is attached to a bottom plate 40 (FIG. 7) of the first lens barrel PP1. The other alignment optical system ALG2 is disposed on the other side of the region through which exposure light (image-forming beam) passes, and is attached to the outer surface of the second lens barrel PP2, like the alignment optical system ALG of the second embodiment as described above. The construction of the other portions or components is similar to those of the first and second embodiments as described above.

The scanning exposure apparatus 200 provides substantially the same effects as provided in the first embodiment, and also provides the following effects. Where the alignment optical systems ALG1, ALG2 include the same detection type sensors (more specifically, alignment sensors of FIA type, LIA type, or LSA type, or scanning probe microscopes such as AFM), alignment marks that are spaced a certain distance apart from each other on the wafer can be detected at the same time or almost at the same time, resulting in improved throughput due to reduction in the alignment time. In this case, the alignment optical systems ALG1, ALG2 may be positioned such that the distance between the detection centers of the alignment optical systems ALG1, ALG2 is substantially equal to the distance between the alignment marks on the wafer.

The alignment optical systems ALG1, ALG2 may also include sensors of different detection types. For example, the LSA type may be suitably used for wafers produced by a wide variety of processes, except aluminum layers, and the LIA type may be effectively used for wafers having small steps or rough surfaces, while the FIA type may be effectively used for aluminum layers and asymmetric marks. Thus, the adaptability to various wafers produced by a wide variety of processes is improved if one of the alignment optical systems ALG1 or ALG2 includes a sensor of one detection type, and the other alignment optical system ALG2 or ALG1 includes a sensor of another detection type different from that of the above-indicated one alignment optical system. Also, three or more alignment optical systems having mutually different detection type sensors may be provided. In this case, since one alignment optical system need not incorporate different detection types of sensors, for example, LIA type, LSA type and FIA type, as in the conventional system, the construction of each of the optical systems can be advantageously simplified, and the number of times of splitting a beam of light with beam splitters can be reduced or made equal to zero, thus enabling highly accurate mark detection.

In another modified example, two pairs of alignment optical systems ALG1, ALG3, and ALG2, ALG4, each pair of which is of the same detection type, may be disposed on one side and the other side, respectively, of a ring-like illumination region IA in the scanning direction, as shown in FIG. 8. In this case, the distance between the alignment optical systems ALG1, ALG3 as measured in the non-scanning direction is set to be substantially equal to the width of the shot region on the wafer as measured in the non-scanning direction, and the distance between the alignment optical systems ALG2, ALG4 is set to be substantially equal to the width of the shot region as measured in the non-scanning direction. With this arrangement, wafer alignment can be carried out during scanning exposure, thus assuring further improved overlapping accuracy as compared with the first and second embodiments as described above. In this case, two-dimensional lattice marks are formed continuously or intermittently along the scanning direction, at opposite ends of each shot region on the wafer in the non-scanning direction (or on the street line between adjacent shots), and the alignment optical systems ALG1, ALG2, ALG3 and ALG4 desirably include sensors, such as LIA type sensors, that are suitable for measuring mark positions with high accuracy during high-speed movement of the wafer.

Fourth Embodiment

Figure 9:
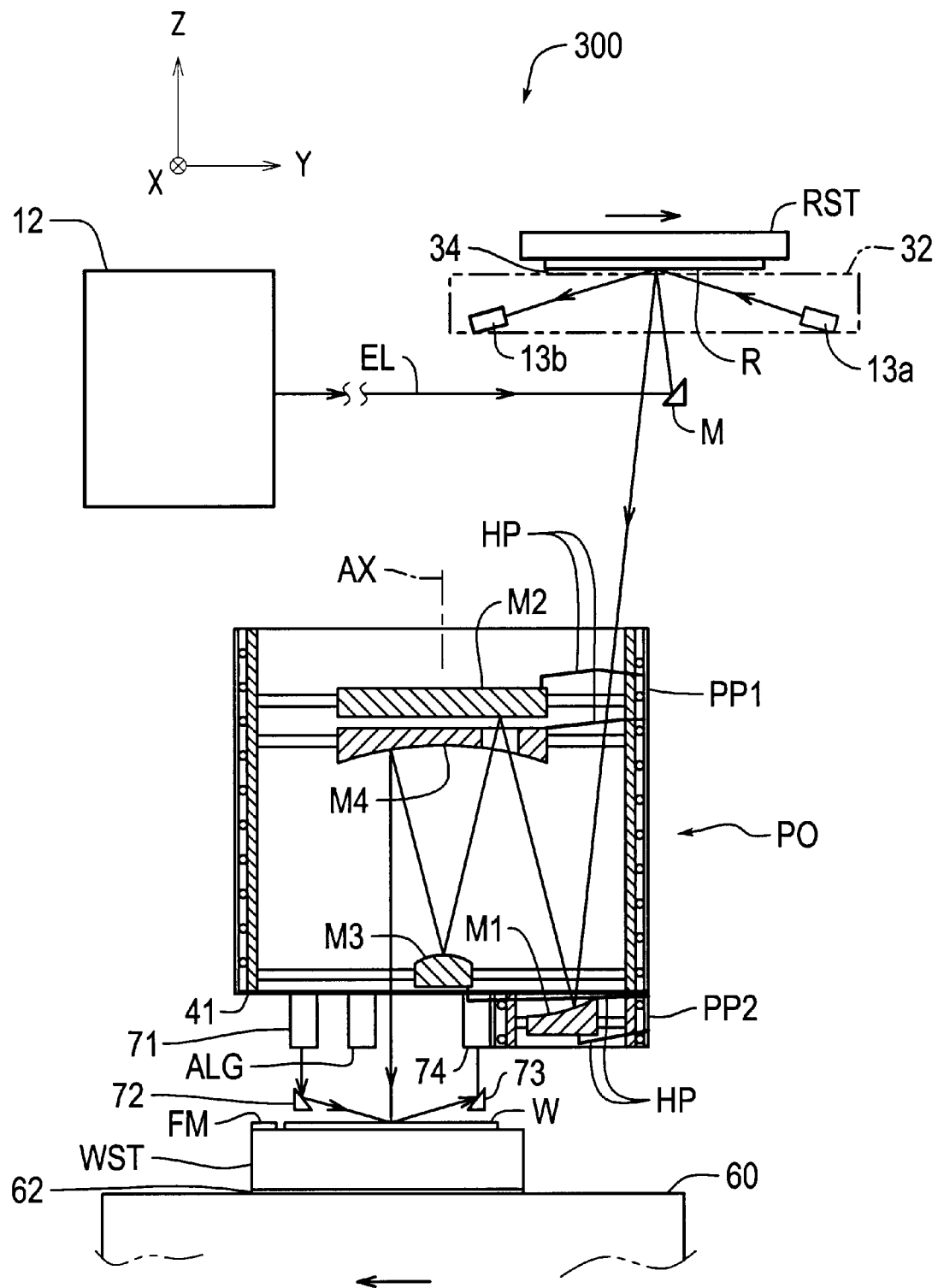
FIG. 9 is a view schematically showing the whole construction of a scanning exposure apparatus according to the fourth embodiment of the present invention.
Figure 10:
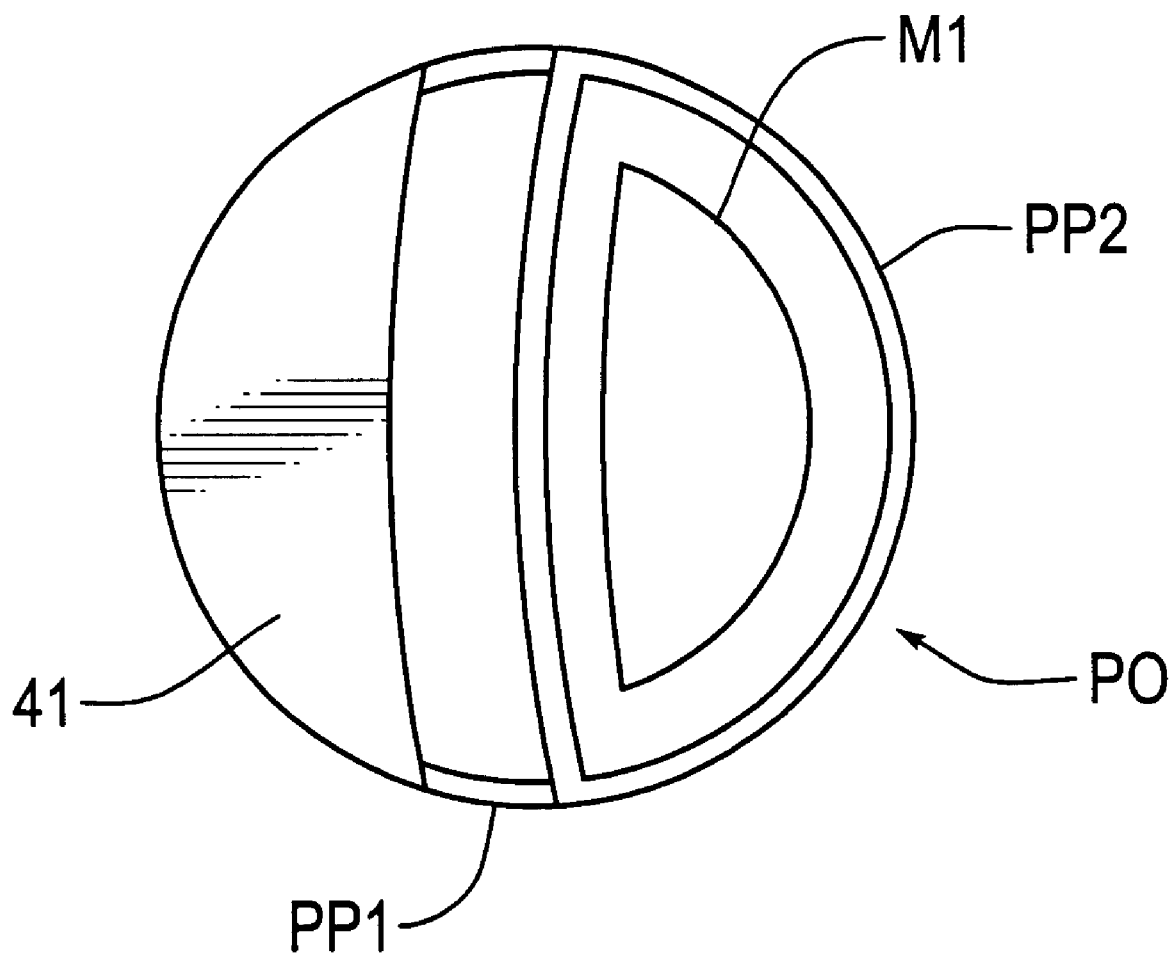
FIG. 10 is a view showing a projection optical system of FIG. 9.

Referring next to FIG. 9 and FIG. 10, the fourth embodiment of the present invention will be described. Here, the same reference numerals as used in the above first through third embodiments will be used to identify the same or equivalent components, of which no description will be provided.

FIG. 9 schematically shows the whole construction of a scanning exposure apparatus 300 according to the fourth embodiment of the invention. The scanning exposure apparatus 300 is a reduction projection exposure apparatus of step-and-scan type. In the scanning exposure apparatus 300, the first mirror M1 assumes a substantially semicircular shape as shown in FIG. 10, with an even larger cutout being formed through the left-hand side portion of its exposure light reflecting region, as compared with the first mirrors of the second and third embodiments. In accordance with the shape of the first mirror M1, the second lens barrel PP2 also has a generally D-shaped cross section that is even flatter than a semicircle, and a focal position detecting device (focus sensor) for detecting the Z position of the wafer, as well as the alignment optical system ALG, is disposed in the space present on the left-hand side of the second lens barrel PP2.

In FIG. 9, the alignment optical system ALG is located at substantially the same position as that in the first embodiment, and is attached to the bottom plate 41 of the first lens barrel PP1. The focal position detecting device consists of a light transmitting system 71 attached to the bottom plate 41, a reflecting mirror 72 for bending a detection beam emitted from the light transmitting system 71 and causing the beam to be obliquely incident on the wafer W, a reflecting mirror 73 for bending the detection beam reflected by the wafer W, and a light receiving system 74 fixed to the outer surface of the second lens barrel PP2 for receiving the reflected beam from the reflecting mirror 73.

The light transmitting system 71 and the reflecting mirror 72, and the light receiving system 74 and the reflecting mirror 73 may be respectively assembled as a unit, but these components are illustrated separately for convenience's sake in FIG. 9. The construction of the other portions of this embodiment is similar to those of the first through third embodiments as described above.

The scanning exposure apparatus 300 of the fourth embodiment constructed as described above provides substantially the same effects as provided in the first embodiment. In addition, the optical path of the detection beam of the focal position detecting device is apparently shorter than that of the first embodiment, thus permitting reduction in the size of the focal position detecting device. It is also possible to reduce variations or fluctuations in the relative position between the projection optical system and the focal position detecting device due to vibrations, thermal deformation or the like, thus assuring improved stability in detecting the position. In this case, too, an objective lens having an even larger N.A. can be used, and the detecting accuracy can be improved.

While EUV light having a wavelength of 11.5 nm is used as exposure light in the first to fourth embodiments as described above, the apparatus of the present invention may also use EUV light having a wavelength of 13.4 nm as exposure light. In this case, a reflecting film of each mirror or reticle needs to be formed from a multi-layer film in which molybdenum Mo and silicon Si are alternately laminated on each other, so as to ensure a reflectance of about 70% with respect to the EUV light having a wavelength of 13.4 nm. Needless to say, EUV light having different wavelengths than 11.5 nm and 13.4 nm, for example, those having a wavelength in the range of 5 to 20 nm, may also be used.

While the first mirror M1 is located very close to the wafer (focal plane of the projection optical system PO) in the illustrated embodiments, the configuration or shape of the mirror is not limited to those of the embodiments, but a single mirror or a plurality of mirrors located very close to the wafer may be otherwise shaped so that a space is present in which the alignment optical system and/or focal position detecting device can be disposed on one side of the image-forming light beam of the reflecting region.

While the lens barrel system consists of the cylindrical first lens barrel PP1 and the D-shaped second lens barrel PP2 in the illustrated embodiments, it is to be understood that the present invention is not limited to this arrangement. For example, an ordinary cylindrical lens barrel may be used, and at least one of the alignment optical system and the focal position detecting device may be disposed in a space (within the lens barrel) on the left-hand side of the first mirror. In another example, an opening may be formed in a part of a large-sized mirror located in the vicinity of the wafer like the first mirror M1, and the alignment optical system and/or the focal position detecting device may be provided within the opening.

While the laser excitation plasma light source is used as the exposure light source in the illustrated embodiments, the apparatus of the present invention may employ any other type of light source, such as a synchrotron radiation light source, a betatron light source, a discharged light source, and an X-ray laser.

In the first through fourth embodiments, EUV light is used as exposure light, and the reflection type projection optical system consisting solely of four reflecting mirrors is employed. It is, however, to be understood that the present invention is not limited to this arrangement. For example, the present invention may be equally applied to an exposure apparatus provided with a projection optical system consisting solely of six mirrors and having a numerical aperture of about 0.25, as disclosed in laid-open Japanese Patent Publication (Kokai) No. 9-211332 and corresponding U.S. Pat. No. 5,815,310. The present invention may also be applied to VUV (Vacuum-Ultraviolet) exposure apparatus which uses a VUV light source having a wavelength of 100 to 160 nm, for example, an $Ar_2$, laser (having a wavelength of 126 nm), and which includes a projection optical system having four to eight mirrors, e.g., a projection optical system having six mirrors and a numerical aperture of about 0.55 to 0.6, as disclosed in U.S. Pat. No. 5,815,310. The disclosure of U.S. Pat. No. 5,815,310 is incorporated herein by reference.

In the case of the VUV exposure apparatus, refractive optical elements may be incorporated as part of the apparatus. As the VUV light may be used a higher harmonic obtained by amplifying a single-wavelength laser beam in an infrared region of visible region that is generated from a DFB (Distributed Feedback) semiconductor laser or fiber laser, with a fiber amplifier doped with, for example, erbium (or erbium and yttrium), and changing the wavelength of the laser beam into ultraviolet light, using a non-linear optical crystal. For example, if the oscillation wavelength of the single-wavelength laser beam is in the range of 1.57 to 1.58 $\mu$m, a tenfold higher harmonic with a wavelength in the range of 157 to 158 $\mu$m, namely, ultraviolet light having substantially the same wavelength as $F_2$ laser, can be obtained.

The exposure apparatus of the present invention may be fabricated in the following manner. Initially, the projection optical system in which a plurality of reflecting optical elements are incorporated in the first and second lens barrels, and at least a part of the illumination optical system having a plurality of reflecting optical elements, are fixed to a base or frame that is supported by a plurality of vibration isolating pads, and optical adjustments are performed on the illumination optical system and projection optical system. In the meantime, wires and pipes are connected to the reticle stage and wafer stage each consisting of a multiplicity of mechanical components, and at least part of the position detecting devices (alignment optical system, focal position detecting device and others) is disposed in a space provided by the reflecting optical element of the projection optical system, followed by total adjustments (electrical adjustments, confirmation of operations). The exposure apparatus is preferably fabricated within a clean room in which the temperature and cleanness are suitably controlled.

Semiconductor devices are manufactured by a process including a step of designing the function and performance of desired devices, a step of producing a reticle based on the design step, a step of forming a wafer of a silicon material, a step of exposing the wafer to light containing a pattern of the reticle by means of the exposure apparatus of FIG. 1, a step of assembling the thus obtained devices (including a dicing process, bonding process and packaging process), and an inspection step.

It is to be understood that the present invention is not limited to details of the illustrated embodiments, but may be otherwise embodied with varies changes or modifications, without departing from the principle of the present invention.

What is claimed is:

1. An apparatus for exposing a substrate with an illumination beam via a mask, comprising:

a projection optical system having an object plane and an image plane and being disposed such that the mask is located on the side of the object plane and the substrate is located on the side of the image plane, said projection optical system including a reflective optical element having a reflective region that is reflective of the illumination beam, and having a space adjacent to the reflective region through which the illumination beam passes; and a position detector, at least a part of which is disposed in said space so as to detect position information of the substrate.

2. An apparatus according to claim 1, further comprising: a stage system that holds the mask on the side of the object plane, and supports the substrate on the side of the image plane, such that the mask and the substrate are moved relative to each other with respect to the illumination beam during scanning exposure of the substrate with the illumination beam.

3. An apparatus according to claim 2, wherein said reflective optical element is an optical element that is closest to the image plane within said projection optical system.

4. An apparatus according to claim 3, wherein said space comprises a space obtained by removing a part of said reflective optical element.

5. An apparatus according to claim 3, wherein said space comprises an opening formed in a part of said reflective optical element.

6. An apparatus according to claim 3, wherein said position detector comprises a first detecting system that detects a mark provided on the side of the image plane of the projection optical system.

7. An apparatus according to claim 6, wherein said position detector comprises two of said first detecting systems having detection centers that are respectively located on opposite sides of an illumination region of the illumination beam, and said two first detecting systems are spaced apart from each other in a direction in which the substrate is moved during exposure of the substrate.

8. An apparatus according to claim 7, wherein said position detector comprises a second detecting system that detects position information of the substrate as viewed in a direction parallel to an optical axis of the projection optical system.

9. An apparatus according to claim 3, wherein said position detector comprises a detecting system that detects position information of the substrate as viewed in a direction parallel to an optical axis of the projection optical system.

10. An apparatus according to claim 3, wherein said projection optical system is a reflection type optical system consisting of a plurality of reflecting optical elements.

11. An apparatus according to claim 10, wherein the illumination beam is an EUV (Extreme Ultra Violet) light whose wavelength is set to within a range of 5 to 20 nm.

12. The apparatus according to claim 1, wherein the illumination beam passing through the space is reflected by the reflective optical element prior to passing through the space.

13. The apparatus according to claim 1, wherein the position detector is arranged between the reflective optical element and an optical axis of the illumination beam that passes through the space.

14. An apparatus for exposing a substrate with an illumination beam via a mask, comprising:

a projection optical system having an object plane and an image plane and being disposed such that the mask is located on the side of the object plane, and the substrate is located on the side of the image plane, said projection optical system including a reflective optical element arranged optically closest to the mask and spatially closest to the substrate;

a space arranged adjacent to a reflective region of the reflective optical element that reflects the illumination beam, and through which the illumination beam can pass without being reflected; and a position detector, at least a part of which is disposed in said space, so as to detect positional information of the substrate.

15. An apparatus according to claim 14, further comprising:

a stage system that holds the mask on the side of the object plane, and supports the substrate on the side of the image plane, such that the mask and the substrate are moved relative to each other with respect to the illumination beam during scanning exposure of the substrate with the illumination beam.

16. An apparatus according to claim 15, wherein said position detector comprises a first detecting system that detects a mark provided on the side of the image plane of the projection optical system.

17. An apparatus according to claim 16, wherein said position detector comprises a second detecting system that detects position information of the substrate as viewed in a direction parallel to an optical axis of the projection optical system.

18. An apparatus according to claim 15, wherein said position detector comprises a detecting system that detects position information of the substrate as viewed in a direction parallel to an optical axis of the projection optical system.

19. An apparatus according to claim 15, wherein said projection optical system is a reflection type optical system consisting of a plurality of reflecting optical elements.

20. An apparatus according to claim 19, wherein said illumination beam is an EUV (Extreme Ultra Violet) light whose wavelength is set to within a range of 5 to 20 nm.

21. An apparatus for exposing a substrate with an illumination beam via a mask, comprising:

a projection optical system having an object plane and an image plane and being disposed such that the mask is located on the side of the object plane, and the substrate is located on the side of the image plane, said projection optical system comprising a reflective optical element having a first region that reflects the illumination beam, and a second region through which the illumination beam is transmitted; and a position detector, at least a portion of which is located in the second region in order to detect position information of the substrate.

22. An apparatus according to claim 21, wherein said reflective optical element is closest to the image plane within the projection optical system.

23. An apparatus according to claim 22, wherein said reflective optical element is optically closest to the mask and physically closest to the substrate.

24. An apparatus according to claim 22, wherein said illumination beam is an EUV (Extreme Ultra Violet) light whose wavelength is set to within a range of 5 to 20 nm.

25. A method for exposing a substrate with an illumination beam via a mask, comprising the steps of:

projecting the illumination beam onto the substrate through a projection optical system comprising a reflective optical element having a first region that reflects the illumination beam, and a second region through which the illumination beam is transmitted; and detecting position information of the substrate by a position detector, at least a part of which is located in the second region.

26. A method for manufacturing a device, comprising a step of transferring a device pattern onto a workpiece, using the exposure method as defined in claim 25.

27. A method for manufacturing an exposure apparatus for exposing a substrate with an illumination beam via a mask, comprising the steps of:

providing a projection optical system that includes a reflective optical element having a first region that reflects the illumination beam, and a second region through which the illumination beam is transmitted; and arranging at least a part of a position detector that detects position information of the substrate, in the second region.

* * * * *